(12) United States Patent
Chen

(10) Patent No.: US 9,105,590 B2
(45) Date of Patent: Aug. 11, 2015

(54) SEMICONDUCTOR STRUCTURE HAVING MATERIAL LAYERS WHICH ARE LEVEL WITH EACH OTHER AND MANUFACTURING METHOD THEREOF

(75) Inventor: Tong-Yu Chen, Hsin-Chu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 533 days.

(21) Appl. No.: 13/206,523

(22) Filed: Aug. 10, 2011

(65) Prior Publication Data

US 2013/0037918 A1 Feb. 14, 2013

(51) Int. Cl.
*H01L 29/06* (2006.01)
*H01L 21/3213* (2006.01)
*H01L 21/033* (2006.01)
*H01L 21/768* (2006.01)

(52) U.S. Cl.
CPC ...... *H01L 21/32139* (2013.01); *H01L 21/0337* (2013.01); *H01L 21/76816* (2013.01); *H01L 21/76838* (2013.01)

(58) Field of Classification Search
CPC .............. H01L 21/76816; H01L 21/31144; H01L 29/7811
USPC .......................... 257/751, E21.579; 438/479
See application file for complete search history.

(56) References Cited

U.S. PATENT DOCUMENTS

| | | | |
|---|---|---|---|
| 5,970,367 A * | 10/1999 | Wanlass | 438/479 |
| 7,247,887 B2 | 7/2007 | King | |
| 2003/0157794 A1* | 8/2003 | Agarwala et al. | 438/627 |
| 2007/0020565 A1 | 1/2007 | Koh | |
| 2007/0158756 A1 | 7/2007 | Dreeskornfeld et al. | |
| 2008/0248429 A1 | 10/2008 | Chou | |
| 2009/0124084 A1* | 5/2009 | Tan et al. | 438/699 |
| 2009/0233238 A1 | 9/2009 | Hsu | |
| 2009/0258500 A1 | 10/2009 | Yang | |
| 2010/0006897 A1 | 1/2010 | Becker | |
| 2011/0037175 A1* | 2/2011 | Bangsaruntip et al. | 257/773 |

OTHER PUBLICATIONS

Robert T. Greenway, Interference Assited Lithography for Patterning of 1D Gridded Design, SPIE Feb. 26, 2009.

* cited by examiner

*Primary Examiner* — Thomas L Dickey
(74) *Attorney, Agent, or Firm* — Winston Hsu; Scott Margo

(57) ABSTRACT

A semiconductor structure is provided in the present invention. The semiconductor structure includes a substrate, a first material layer and a second material layer. A trench region is defined on the substrate. The trench region includes two separated first regions and a second region, wherein the second region is adjacent to and between the two first regions. The first material layer is disposed on the substrate outside the trench region. The second material layer is disposed in the second region and is level with the first material layer.

20 Claims, 18 Drawing Sheets

SEMICONDUCTOR STRUCTURE HAVING MATERIAL LAYERS WHICH ARE LEVEL WITH EACH OTHER AND MANUFACTURING METHOD THEREOF

BACKGROUND OF THE INVENTION

1. Field of the Invention

The present invention relates to a semiconductor structure and a manufacturing method thereof, and more particularly, to a semiconductor structure having two dielectric layers in the same layer and a manufacturing method thereof.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer, for example down to feature sizes of 65 nanometers (nm), 45 nm and even to 32 nm. The width is subject to optical characteristics, however. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes, resulting in deformation of the transfer pattern. For example, right-angled corner rounded phenomenon, line end shortened phenomenon, and line width increase/decrease phenomenon are well known defects resulting from OPE.

A double-exposure technique has been developed in recent years, which involves forming a target pattern by two exposure processes; however, the double-exposure technique still has some problems that need to be overcome.

SUMMARY OF THE INVENTION

The present invention therefore provides a semiconductor structure and a manufacturing method thereof, which can alleviate OPE and can form desired patterns.

According to one embodiment, a semiconductor structure is provided in the present invention. The semiconductor structure includes a substrate, a first material layer and a second material layer. A trench region is defined on the substrate. The trench region includes two separated first regions and a second region, wherein the second region is adjacent to and between the two first regions. The first material layer is disposed on the substrate outside the trench region. The second material layer is disposed in the second region and is level with the first material layer.

According to another embodiment, a method of manufacturing a semiconductor structure is provided. A substrate is provided. A trench region is defined on the substrate. The trench region includes two separated first regions and one second region, wherein the second region is adjacent to and between the two first regions. A first material layer is formed on the substrate and then the first material layer in the trench region is removed to form a first patterned material layer. Then, a second patterned material layer is formed in the first region on the substrate, wherein the first patterned material layer is level with the second patterned material layer.

By using the double-exposure technique provided in the present invention, the trenches or the stripe structures of the semiconductor structure proposed in the present invention can include a nearly rectangular pattern, which is free of the right-angled corner rounded phenomenon.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1A:
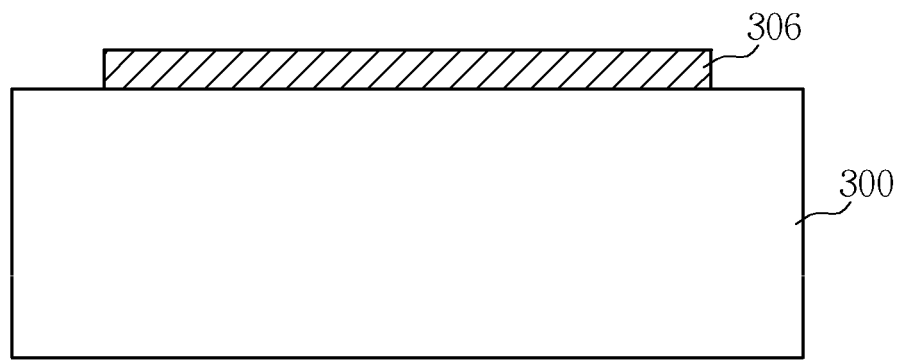
FIG. 1A, FIG. 1B, FIG. 2A, FIG. 2B, FIG. 3A and FIG. 3B, illustrate schematic diagrams of the method of manufacturing a semiconductor structure according to the first embodiment of the present invention
Figure 1B:
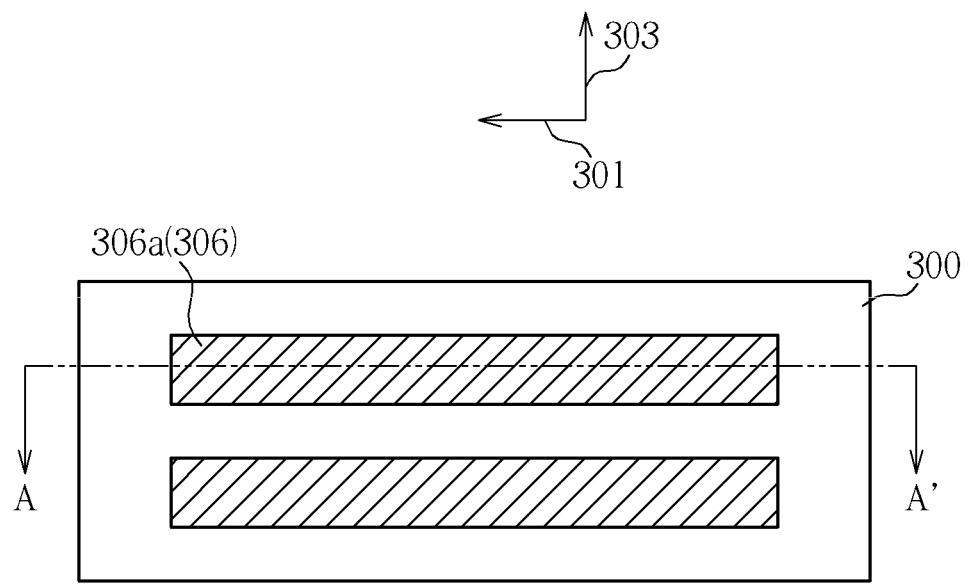
Figure 2A:
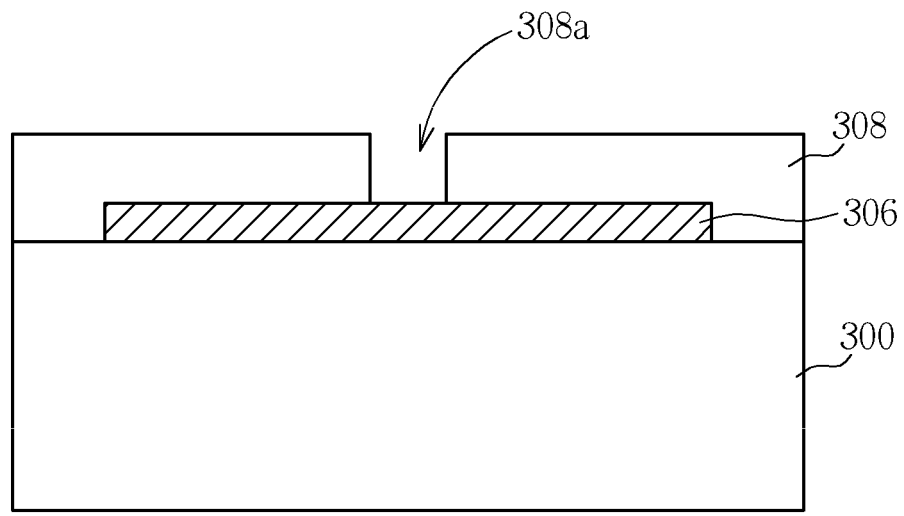
Figure 2B:
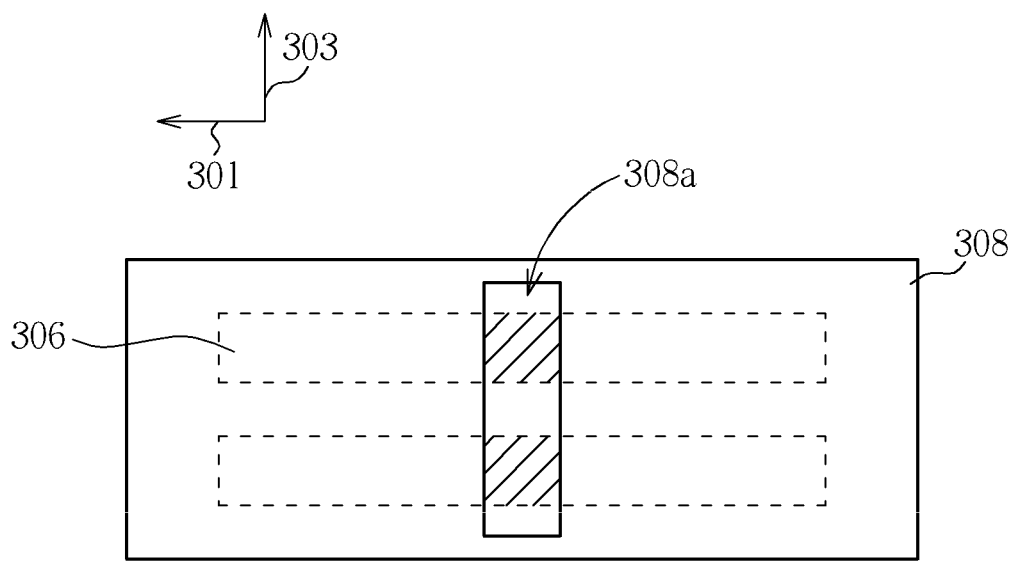
Figure 3A:
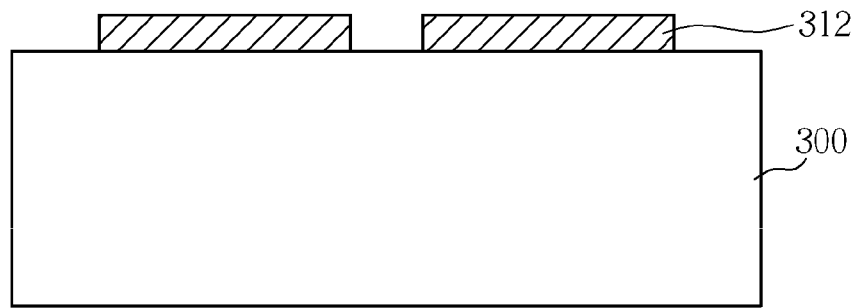

Please refer to FIG. 1A, FIG. 1B, FIG. 2A, FIG. 2B, FIG. 3A and FIG. 3B, illustrating schematic diagrams of the method of manufacturing a semiconductor structure according to the first embodiment of the present invention. FIG. 1A, FIG. 2A and FIG. 3A are cross-sectional views of FIG. 1B, FIG. 2B and FIG. 3B taken along line AA' in FIG. 1B. As shown in FIG. 1A and FIG. 1B, a substrate 300 is provided. The substrate 300 can include a semiconductor substrate, such as a silicon substrate, an epitaxial silicon substrate, a silicon germanium substrate, a silicon carbide substrate or a silicon-on-insulator (SOI) substrate. In another embodiment, the substrate 300 can include a non-semiconductor substrate, such as a glass substrate for a thin-film-transistor display device formed thereon, or a fused quartz for a photo mask formed thereon. In another embodiment, the substrate 300 can include a plurality of doping regions, one or a plurality of dielectric layers or a metal interconnect system in which one or a plurality of microelectronic components are disposed therein, such as a complementary metal oxide semiconductor (CMOS) or a photo-diode. Then, a first patterned material layer 306 is formed on the substrate 300. In one embodiment, the first patterned material layer 306 includes poly-silicon. The first patterned material layer 306 includes a plurality of first stripe structures 306a which are substantially parallel to each other along the first direction 301. For example, a first material layer (not shown) can be formed on the substrate 300. Then a patterned photoresist layer (not shown) is formed on the first material layer. An etching process is carried out to form the first patterned material layer 306.

As shown in FIGS. 2A and 2B, a patterned photoresist layer 308 is formed on the first patterned material layer 306. The patterned photoresist layer 308 includes a trench 308a to expose a part of the first patterned material layer 306. In one preferred embodiment of the present invention, the trench 308a extends along a second direction 303, which is substantially perpendicular to the first direction 301.

Figure 3B:
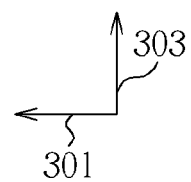
Figure 3B:
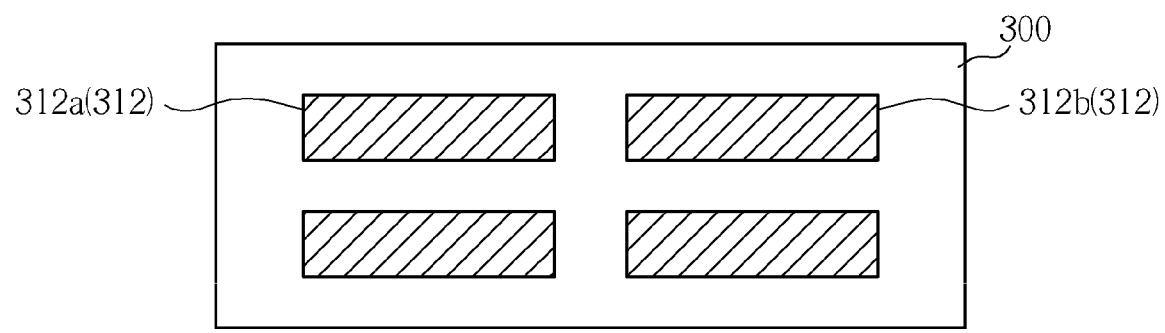

As shown in FIG. 3A and FIG. 3B, an etching process is carried out by using the patterned photoresist layer 308 as a mask to remove the patterned material layer 306 exposed by the trench 308a, thereby forming a second patterned material layer 312. After the etching process, at least one first stripe structure 306a in the first patterned material layer 306 is cut off, forming a second stripe structure 312a and a third strip structure 312b in the second patterned material layer 312. The second stripe structure 312a and the third stripe structure 312b form a nearly rectangular pattern. Through the above methods, the right-angled corner rounded phenomenon caused by OPE can be alleviated. Finally, the patterned photoresist layer 308 is removed.

Figure 4A:
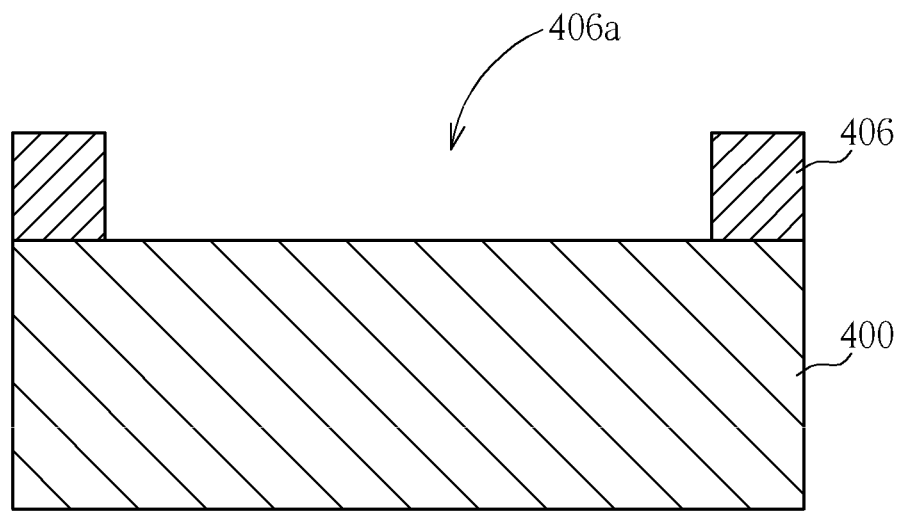
FIG. 4A, FIG. 4B, FIG. 5A, FIG. 5B, FIG. 6A, FIG. 6B, FIG. 7A and FIG. 7B illustrate schematic diagrams of the method of manufacturing a semiconductor structure according to the second embodiment of the present invention.
Figure 4B:
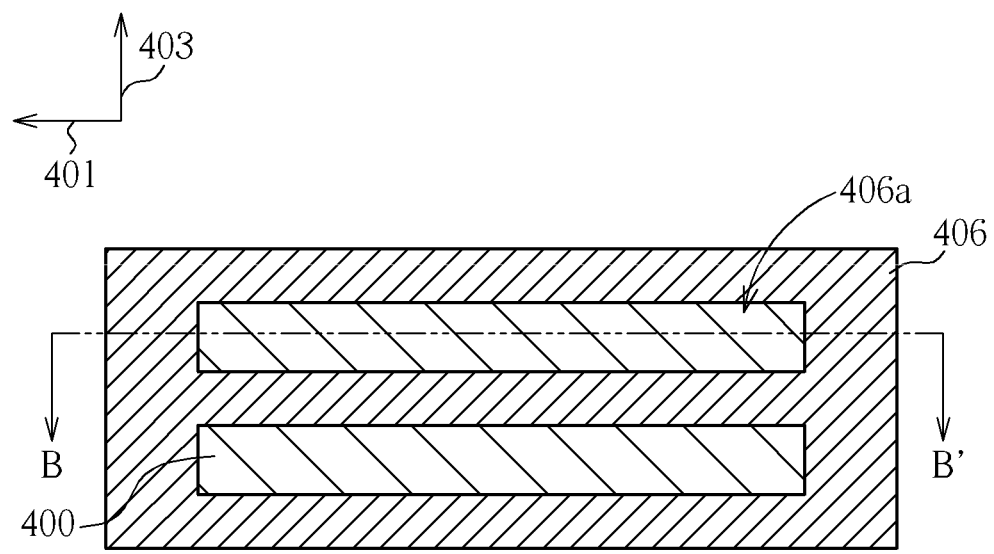

Please refer to FIG. 4A, FIG. 4B, FIG. 5A, FIG. 5B, FIG. 6A, FIG. 6B, FIG. 7A and FIG. 7B, illustrating schematic diagrams of the method of manufacturing a semiconductor structure according to the second embodiment of the present invention. FIG. 4A, FIG. 5A, FIG. 6A, FIG. 7A are cross-sectional views of FIG. 4B, FIG. 5B, FIG. 6B, FIG. 7B taken along line BB' in FIG. 4B. As shown in FIG. 4A and FIG. 4B, a substrate 400 is provided. Then, a first patterned material layer 406 is formed on the substrate 400. The first patterned material layer 406 includes a plurality of first trenches 406a, which are substantially parallel to each other along a first direction 401. The first patterned material layer 402 includes a hard mask material such as SiN, metal or advanced pattern film (APF) provided by Applied Material or an inter-dielectric layer (ILD)/inter-metal dielectric layer (IMD) layer material such as $SiO_2$.

Figure 5A:
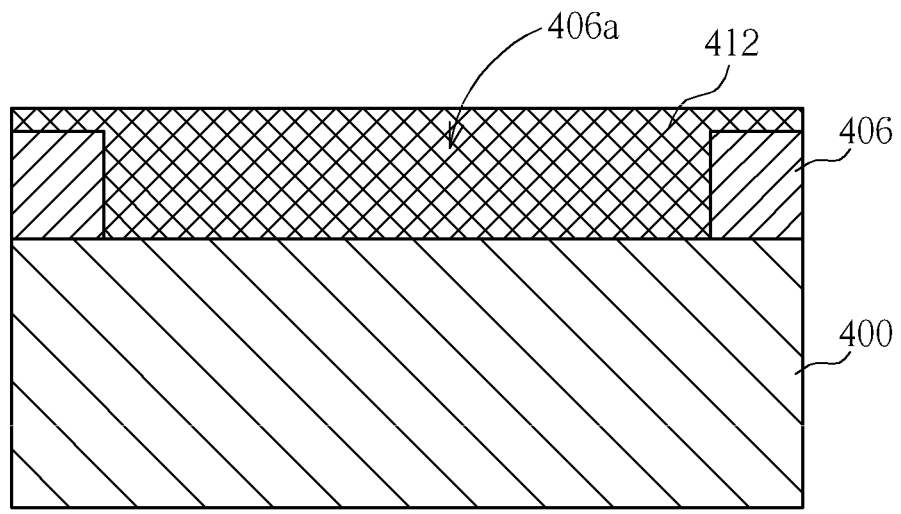
Figure 5B:
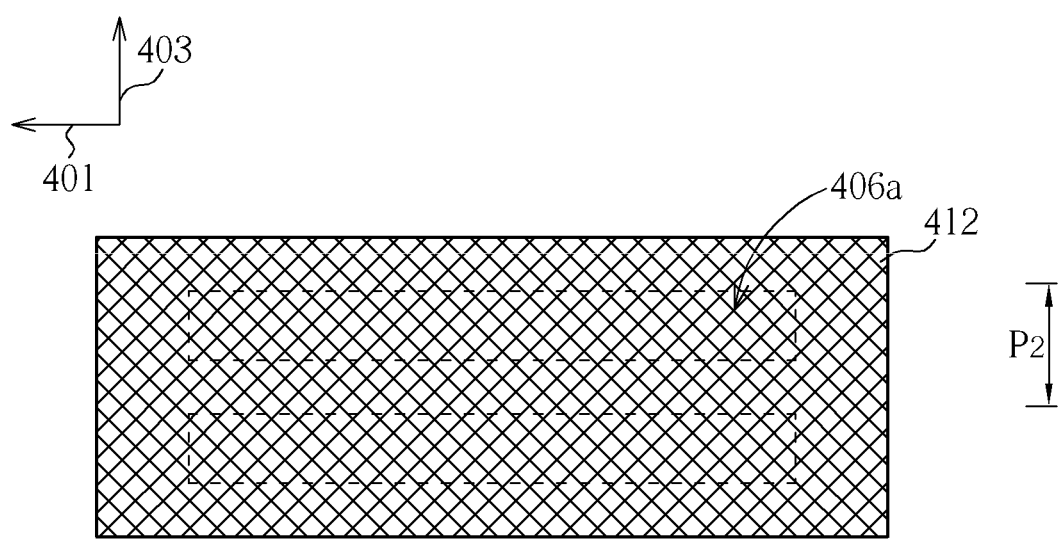

As shown in FIG. 5A and FIG. 5B, a second material layer 412 is formed on the substrate 400 to at least completely fill the first trenches 406a in the first patterned material layer 406. In one preferred embodiment of the present invention, the second material layer 412 includes a hard mask material such as SiN, metal or advanced pattern film (APF) or an inter-dielectric layer (ILD)/inter-metal dielectric layer (IMD) layer material such as $SiO_2$. It is noted that the material of the second material layer 412 has an etching selectivity with respect to that of the first patterned material layer 406. For example, the first patterned material layer 406 may be a CVD $SiO_2$ and the second material layer 412 may be a spin-on dielectric layer (SOD). In another embodiment, the first patterned material layer 406 and the second material layer 412 are dielectric layers having etching selectivity by adjusting the ratio of carbon or pore density in a CVD process.

Figure 6A:
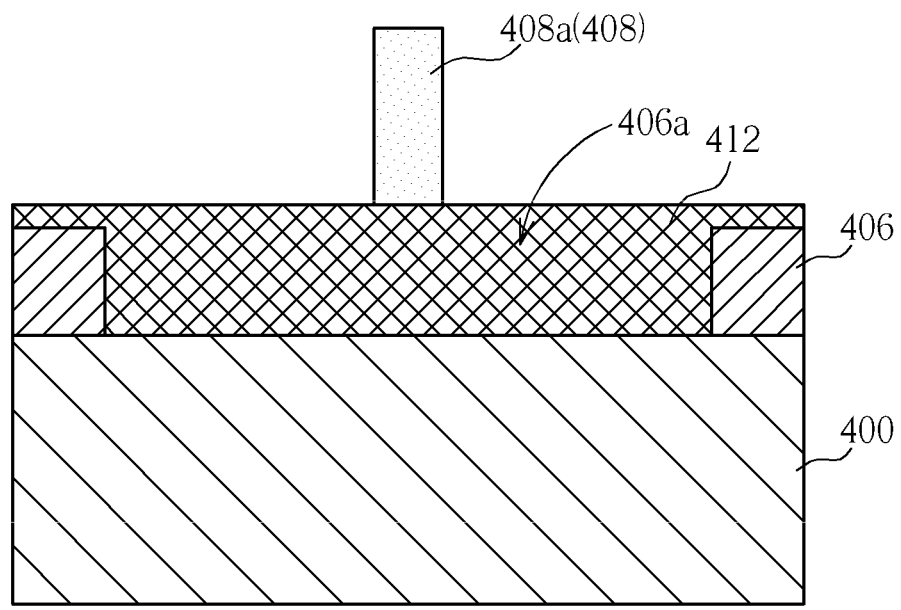
Figure 6B:
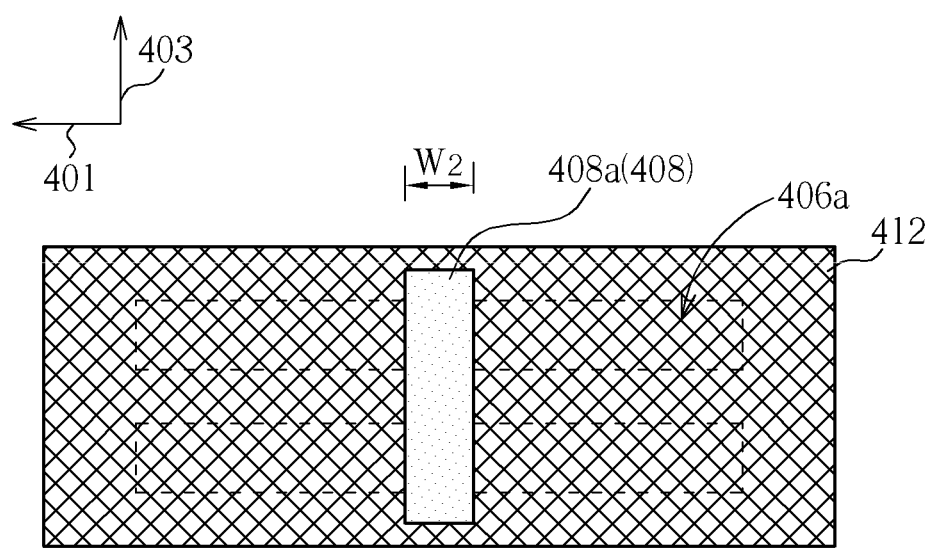

As shown in FIG. 6A and FIG. 6B, a patterned photoresist layer 408 is formed on the second material layer 412. The patterned photoresist layer 408 includes at least a stripe structure 408a, which extends along a second direction 403. The second direction 403 is substantially perpendicular to the first direction 401. The stripe structure 408a covers a part of the first trench 406a. In one embodiment, the stripe structure 408 includes a width W2 which is substantially equal to the critical dimension (CD) of the exposure system used in the semiconductor manufacturing method.

Figure 7A:
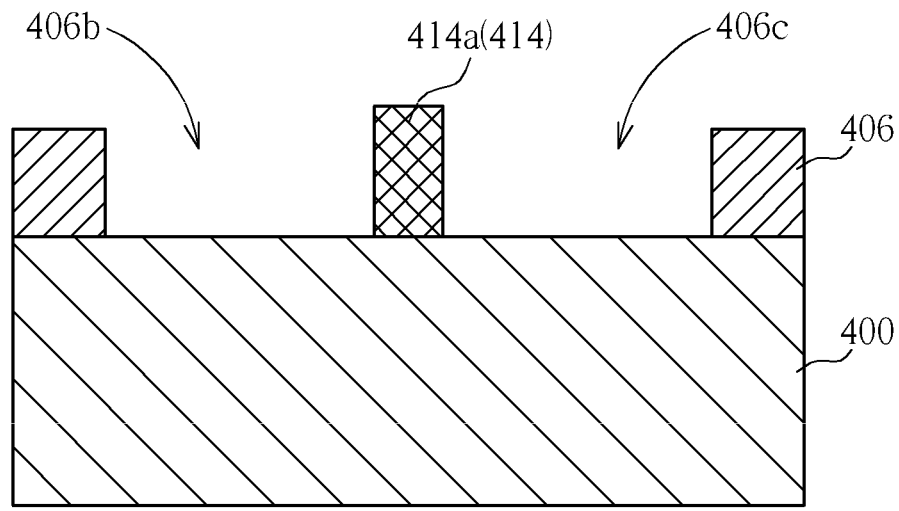
Figure 7B:
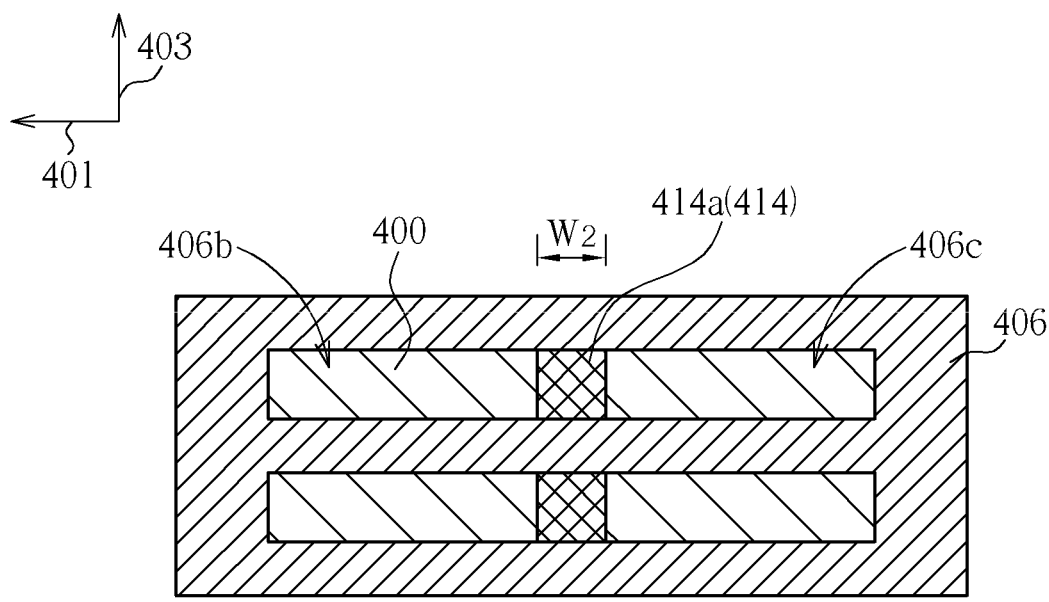

As shown in FIG. 7A and FIG. 7B, an etching process is carried out by using the patterned photoresist layer 408 as a mask to remove the second material layer 408 not covered by the second patterned photoresist layer 412, thereby forming a second patterned material layer 414. As an etching selectivity is made between the second material layer 412 and the first patterned material layer 406, only the second material layer 412 is patterned by the patterned photoresist layer 408. As shown in FIG. 7A and FIG. 7B, the second patterned material layer 414 includes a separation structure 414a disposed within the first trench 406a of the first patterned material layer 406, so as to separate the first trench 406a into a second trench 406b and a third trench 406c. The second trench 406b and the third trench 406c form a nearly rectangular pattern. The separation structure 404a also includes a rectangular pattern containing a width W2. Through the above methods, the right-angled corner rounded phenomenon caused by OPE can be alleviated. Finally, the patterned photoresist layer 408 is removed.

Figure 8:
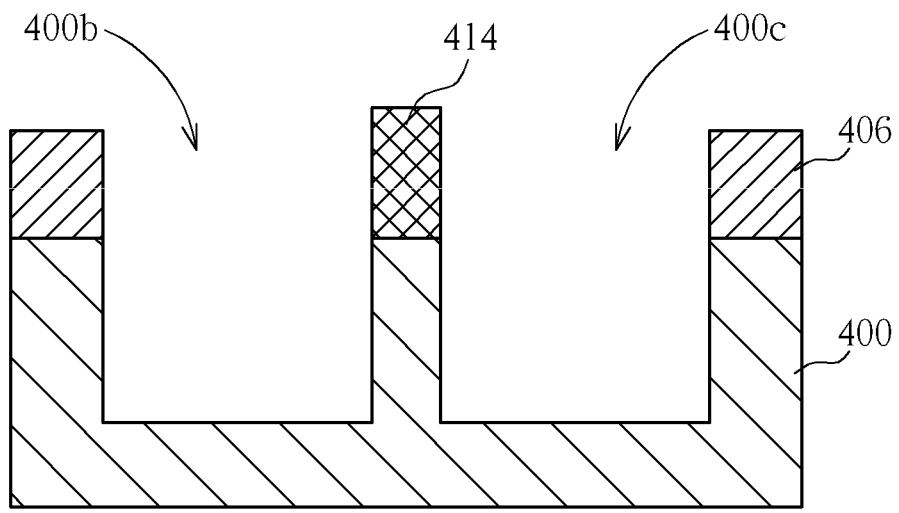
FIG. 8 and FIG. 9 illustrate schematic diagrams of the method of manufacturing a semiconductor structure according to one embodiment of the present invention.

Please refer to FIG. 8, illustrating a schematic diagram of the method of manufacturing a semiconductor structure according to one embodiment of the present invention. As shown in FIG. 8, when the first patterned material layer 406 and the second patterned material layer 414 include hard mask materials, after the steps in FIG. 7A and FIG. 7B, an etching process can further be provided. For example, by using the first patterned material layer 406 and the second patterned material layer 414 as a mask, the substrate 400 is etched to form a fourth trench 400b and a fifth trench 400c. Similarly, the fourth trench 400b and the fifth trench 400c form a nearly rectangular pattern.

Figure 9:
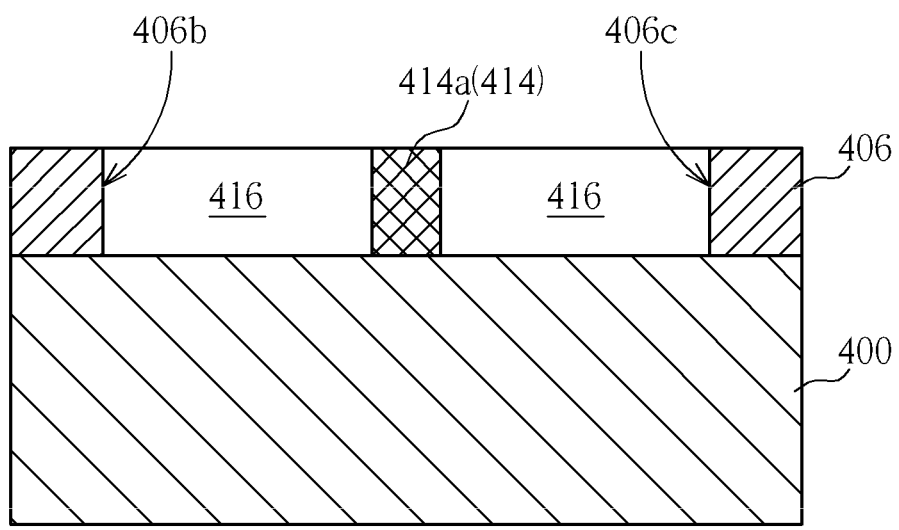

Please refer to FIG. 9, illustrating a schematic diagram of the method of manufacturing a semiconductor structure according to one embodiment of the present invention. As shown in FIG. 9, when the first patterned material layer 406 and the second patterned material layer 414 include dielectric materials, after the steps in FIG. 7A and FIG. 7B, a third material layer 416 can further be formed in the second trench 406b and the third trench 406c. For example, a third material layer 416 is formed on the substrate 400 and a planarization process is carried out such that the first patterned material layer 406 and the second patterned material layer 414 are level with the third material layer 416. In one preferred embodiment, the third material layer 416 includes conductive material such as metal, which can electrically connected to the metal interconnection system (not shown) or the micro electronic components in the substrate 400.

Figure 10A:
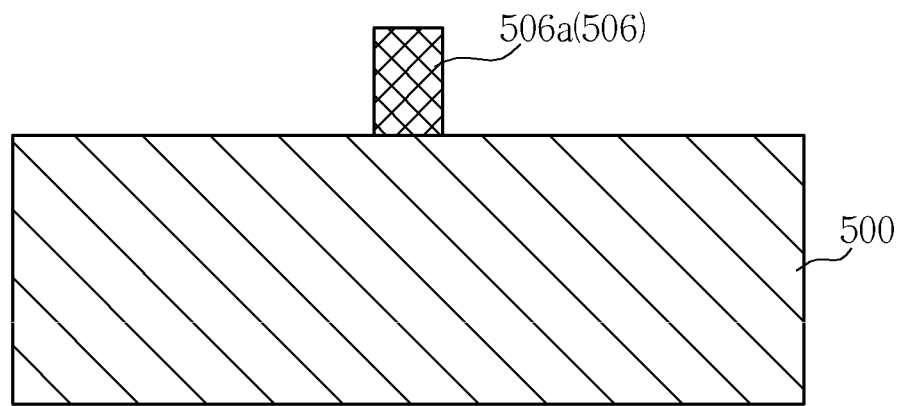
FIG. 10A, FIG. 10B, FIG. 11A, FIG. 11B, FIG. 12A, FIG. 12B, FIG. 13A and FIG. 13B illustrate schematic diagrams of the method of manufacturing a semiconductor structure according to the third embodiment of the present invention.
Figure 10B:
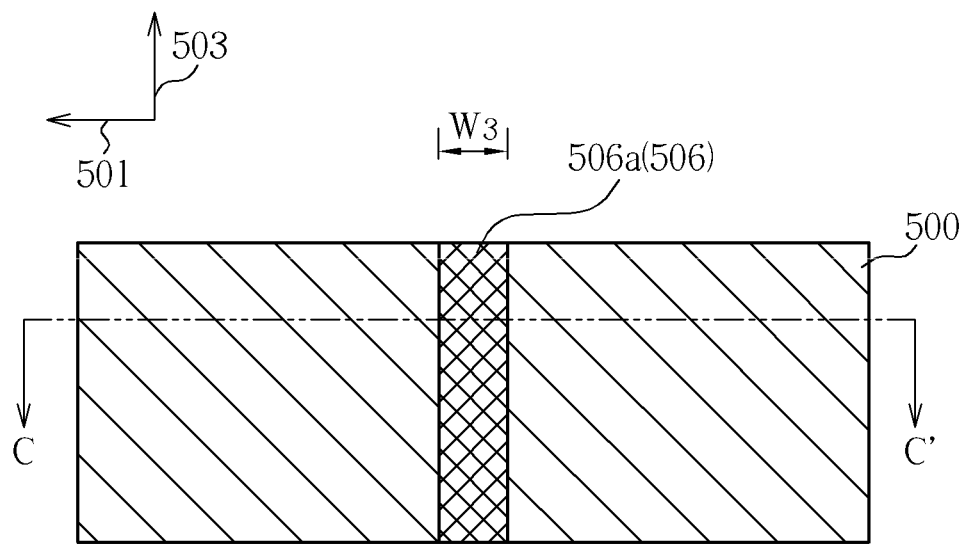

Please refer to FIG. 10A, FIG. 10B, FIG. 11A, FIG. 11B, FIG. 12A, FIG. 12B, FIG. 13A and FIG. 13B, illustrating schematic diagrams of the method of manufacturing a semiconductor structure according to the third embodiment of the present invention. FIG. 10A, FIG. 11A, FIG. 12A, FIG. 13A are cross-sectional views of FIG. 10B, FIG. 11B, FIG. 12B, FIG. 13B taken along line CC' in FIG. 10B. As shown in FIG. 10A and FIG. 10B, a substrate 500 is provided. Then, a first patterned material layer 502 is formed on the substrate 500. The first patterned material layer 506 includes a separation structure 506a, extending along a second direction 503 and has a weight W3, which is substantially equal to the critical dimension of the exposure system used in the semiconductor manufacturing method. The first patterned material layer 506 includes a hard mask material such as SiN, metal or advanced pattern film (APF) or an ILD/IMD layer material such as $SiO_2$.

Figure 11A:
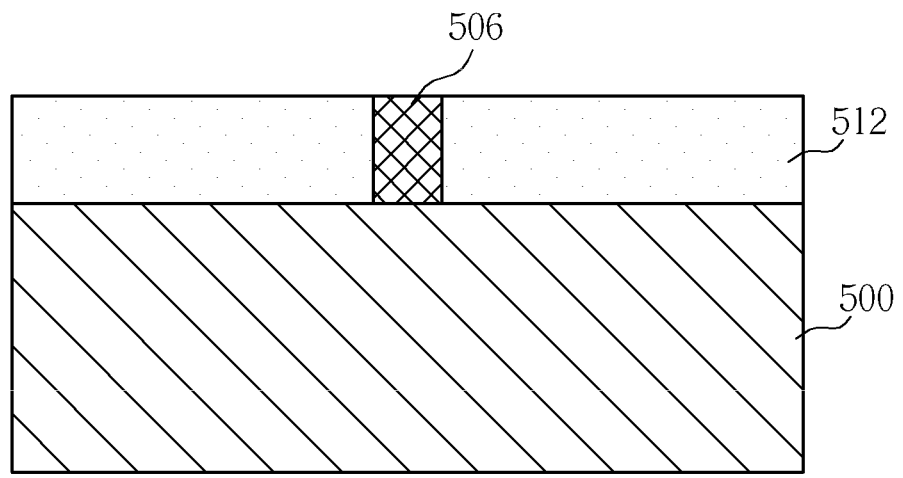
Figure 11B:
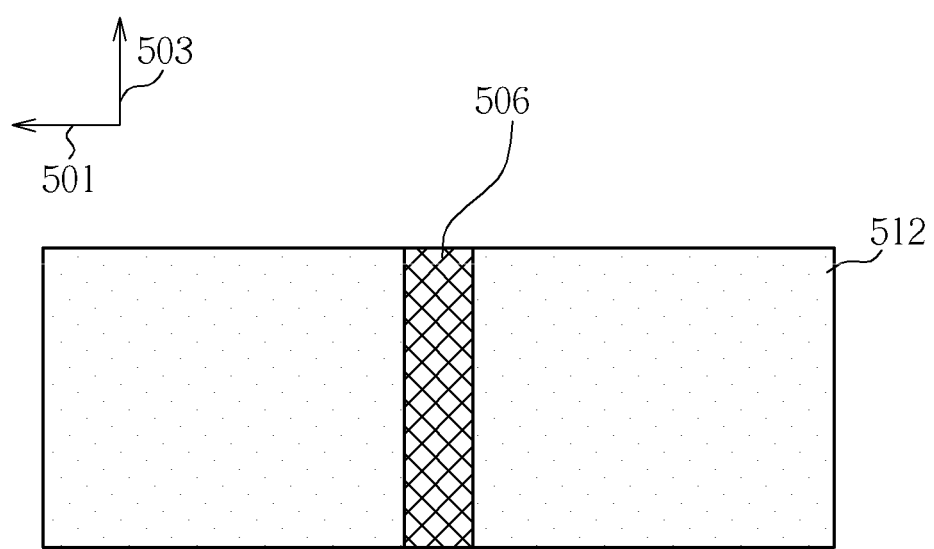

As shown in FIG. 11A and FIG. 11B, a second material layer 512 is formed on the substrate 500. The second material layer 512 is level with the first patterned material layer 506.

For example, a second material layer 512 can be deposited on the substrate 500. A planarization process, such as a chemical mechanical polish (CMP) process or an etching back process is carried such that the second material layer 512 is level with the first patterned material layer 506. In one embodiment, the second material layer 512 includes a hard mask material such as SiN, metal or advanced pattern film (APF) or an inter-dielectric layer (ILD)/inter-metal dielectric layer (IMD) layer material such as $SiO_2$. It is noted that the material of the second material layer 512 has an etching selectivity with respect to that of the first patterned material layer 506.

Figure 12A:
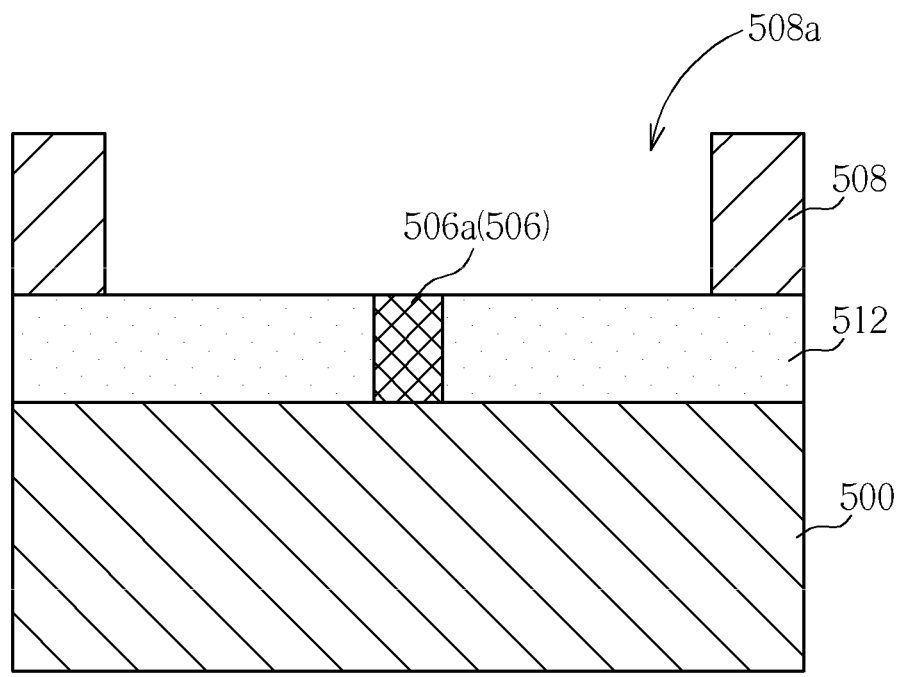
Figure 12B:
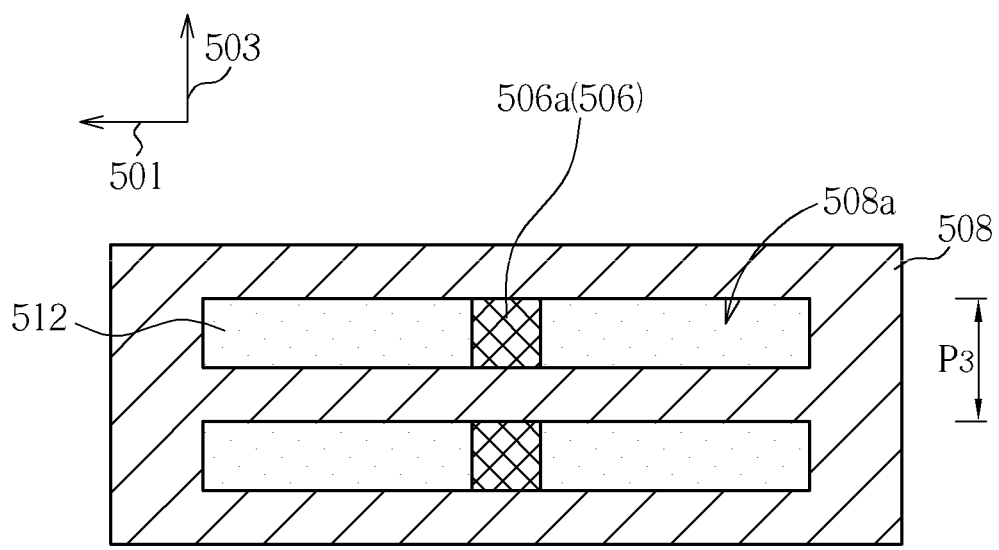

As shown in FIG. 12A and FIG. 12B, a patterned photoresist layer 508 is formed on the second material layer 512. The patterned photoresist layer 508 includes a plurality of trenches 508a, which are substantially parallel to each other along a first direction 501. The first direction 501 is substantially perpendicular to the second direction 503.

Figure 13A:
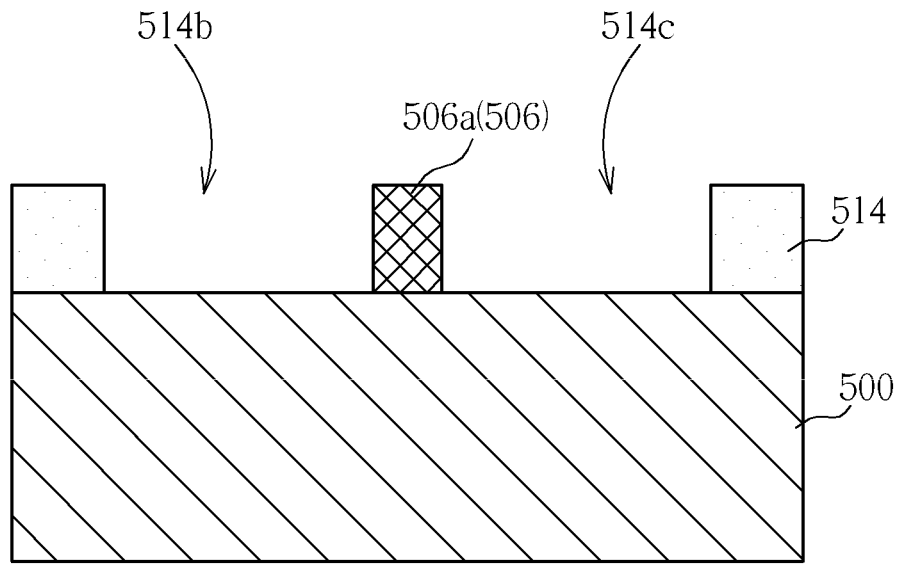
Figure 13B:
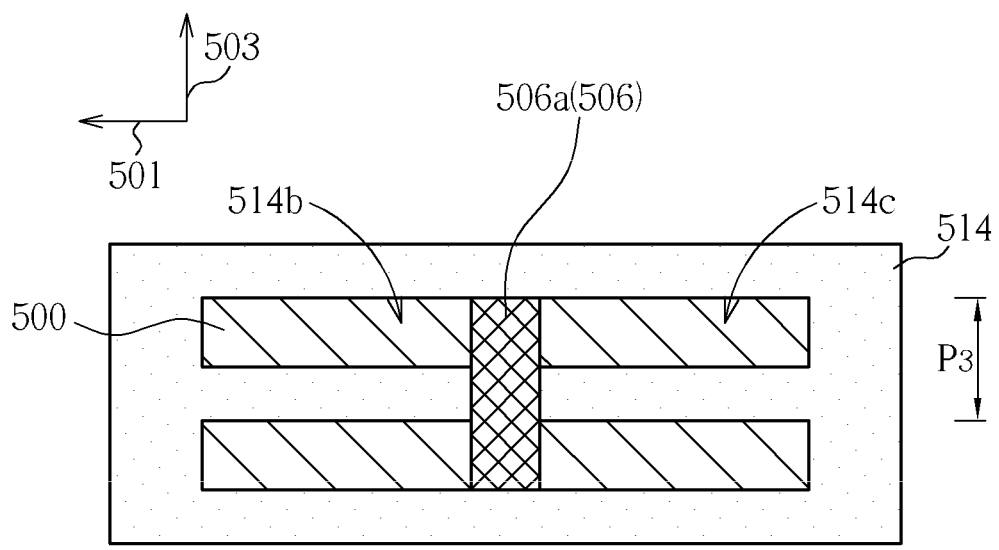

As shown in FIG. 13A and FIG. 13B, an etching process is carried out by using the patterned photoresist layer 508 as a mask to remove the second material layer 512 not covered by the patterned photoresist layer 508 thereby forming a second patterned material layer 514. As an etching selectivity is made between the second material layer 512 and the first patterned material layer 506, only the second material layer 512 is patterned by the patterned photoresist layer 508. As shown in FIG. 13A and FIG. 13B, a plurality of second trenches 514b and a plurality of third trenches 514c are formed in the second patterned material layer 512c. Each second trench 514b corresponds to one third trench 514c and is separated from one third trench 514c by the separation structure 506a in the first patterned material layer 506. It is noted that the separation structure 506a in the first patterned material layer 506 of the present embodiment connect two or more than two sets of second trenches 514b and the third trenches 514c. The second trench 514b and the third trench 514c have a nearly rectangular pattern. Through the above methods, the right-angled corner rounded phenomenon caused by OPE can be alleviated. Finally, the patterned photoresist layer 508 is removed.

Similarly, in another embodiment, when the first patterned material layer 506 and the second patterned material layer 514 include hard mask materials, an etching process can further be provided by using the first patterned material layer 506 and the second patterned material layer 514 as a mask to etch the substrate 500, resulting in a structure similar to that in FIG. 8. In another embodiment, when the first patterned material layer 506 and the second patterned material layer 514 include dielectric materials, a third material layer can further be formed in the second trench 514b and the third trench 514c, resulting in a structure similar to that in FIG. 9.

Figure 14A:
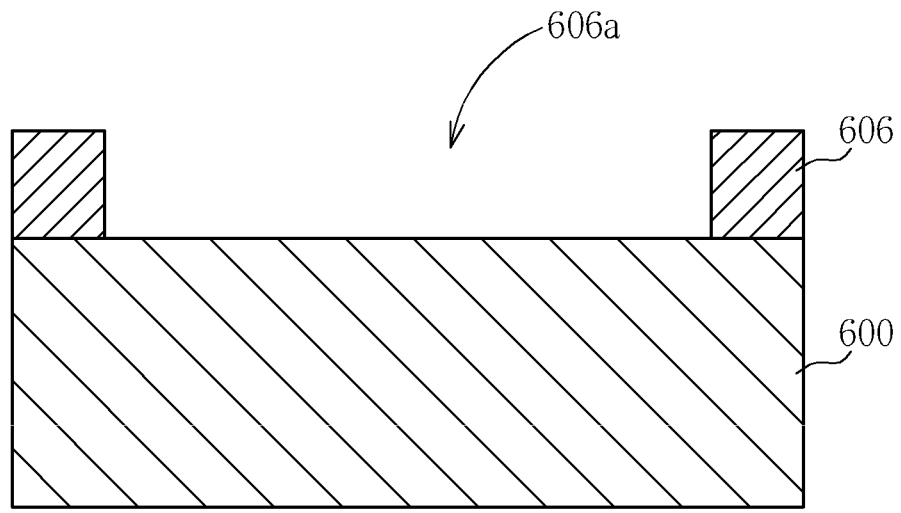
FIG. 14A, FIG. 14B, FIG. 15A, FIG. 15B, FIG. 16A, FIG. 16B, FIG. 17A, FIG. 17B, FIG. 18A and FIG. 18B illustrate schematic diagrams of the method of manufacturing a semiconductor structure according to the fourth embodiment of the present invention.
Figure 14B:
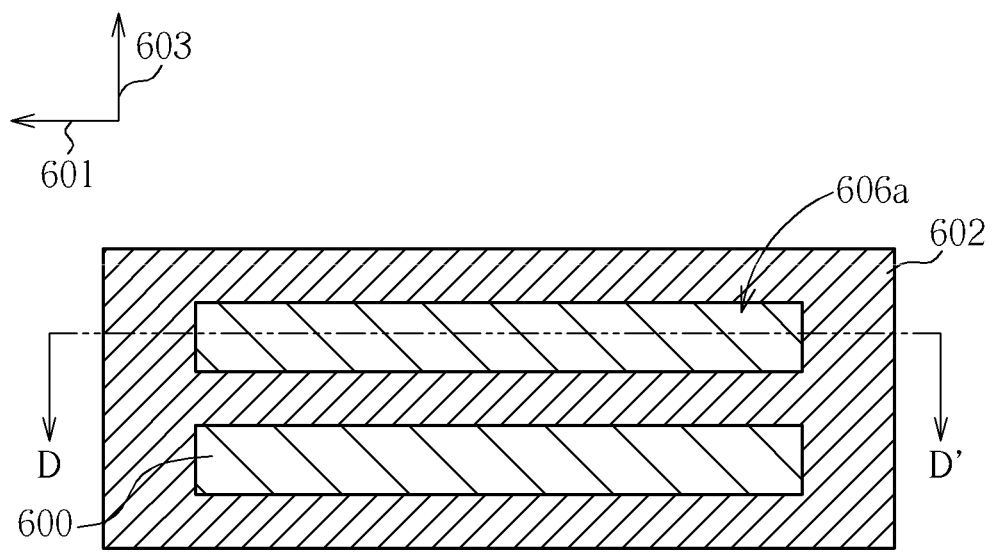

Please refer to FIG. 14A, FIG. 14B, FIG. 15A, FIG. 15B, FIG. 16A, FIG. 16B, FIG. 17A and FIG. 17B, FIG. 18A and FIG. 18B, illustrating schematic diagrams of the method of manufacturing a semiconductor structure according to the fourth embodiment of the present invention. FIG. 174, FIG. 15A, FIG. 16A and FIG. 17A and FIG. 18A are cross-sectional views of FIG. 14B, FIG. 15B, FIG. 16B, FIG. 17B and FIG. 18B taken along line DD' in FIG. 14B. As shown in FIG. 14A and FIG. 14B, a substrate 600 is provided. Then, a first patterned material layer 606 is formed on the substrate 600. The first patterned material layer 606 includes a plurality of first trenches 606a, which are substantially parallel to each other along the first direction 601. The first patterned material layer 606 includes a hard mask material such as SiN, metal or advanced pattern film (APF) or an inter-dielectric layer (ILD)/inter-metal dielectric layer (IMD) layer material such as $SiO_2$.

Figure 15A:
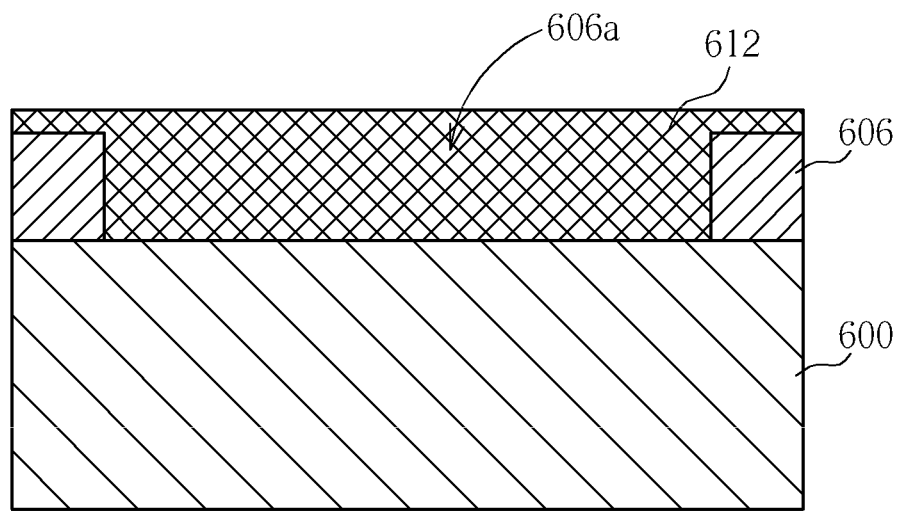
Figure 15B:
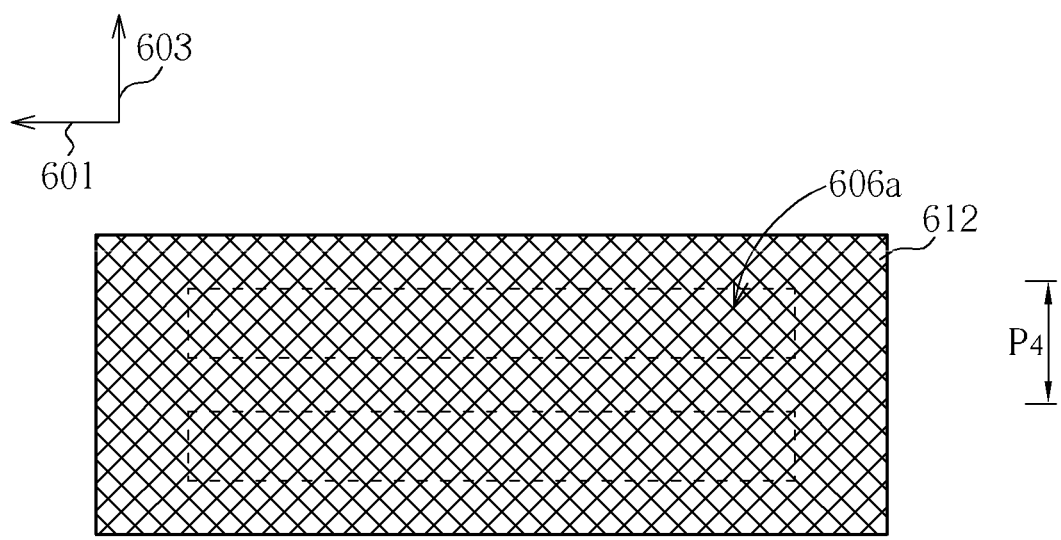

As shown in FIG. 15A and FIG. 15B, a second material layer 612 is formed on the substrate 600 to at least completely fill the first trenches 606a in the first patterned material layer 606. In one preferred embodiment, the second material layer 612 covers on the first patterned material layer 606 such that the first material layer 606 is not exposed. In one preferred embodiment of the present invention, the second material layer 612 includes a hard mask material such as SiN, metal or advanced pattern film (APF) or an inter-dielectric layer (ILD)/inter-metal dielectric layer (IMD) layer material such as $SiO_2$. In the present embodiment, the first patterned material layer 606 can uses the same material as the second material layer 612.

Figure 16A:
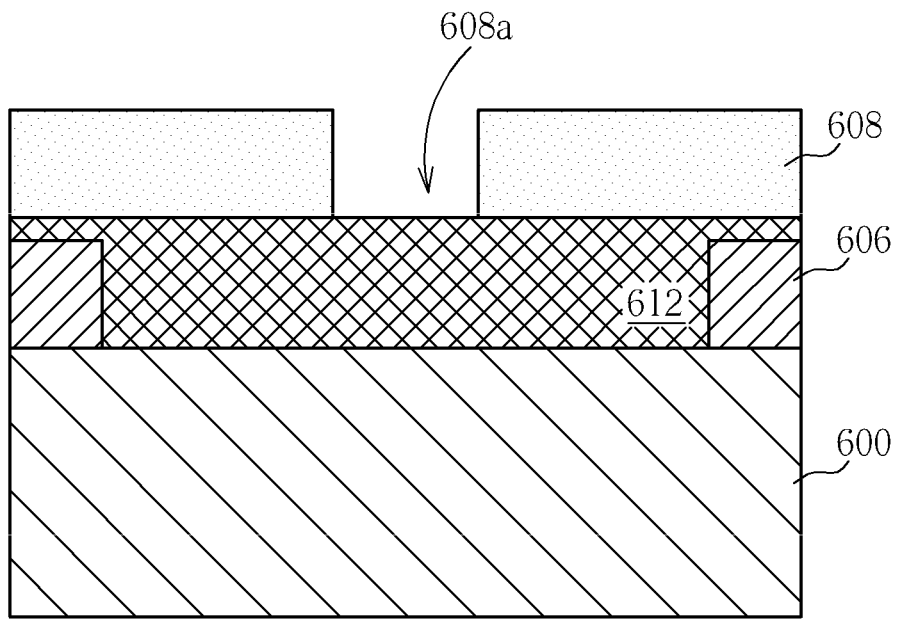
Figure 16B:
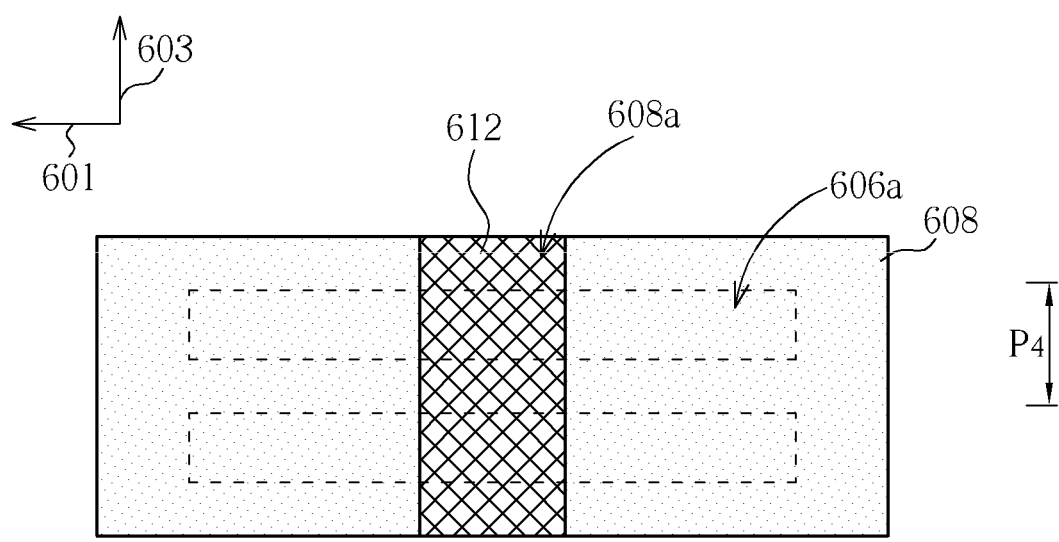

As shown in FIG. 16A and FIG. 16B, a patterned photoresist layer 608 is formed on the second material layer 612. The patterned photoresist layer 608 includes a plurality of trenches 608a, which are substantially parallel to each other along a second direction 603. The second direction 603 is substantially perpendicular to the first direction 601.

Figure 17A:
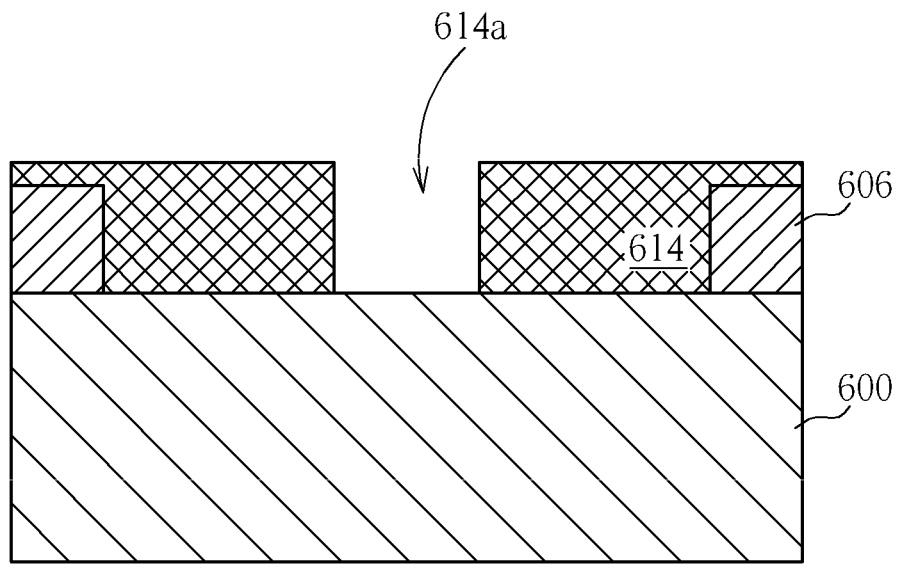
Figure 17B:
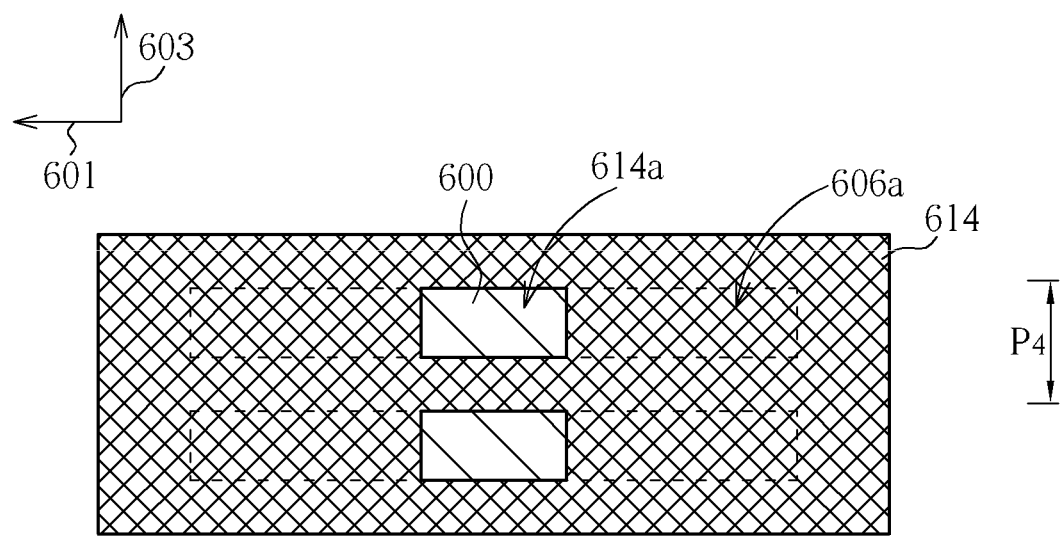

As shown in FIG. 17A and FIG. 17B, an etching process is carried out by using the patterned photoresist layer 608 as a mask to remove the second material layer 612 not covered by the patterned photoresist layer 608, thereby forming a second patterned material layer 614. As shown in FIG. 17A and FIG. 17B, the second patterned material layer 614 includes a plurality of second trenches 614a disposed corresponding to the first trench 606a in the first patterned material layer 606.

Figure 18A:
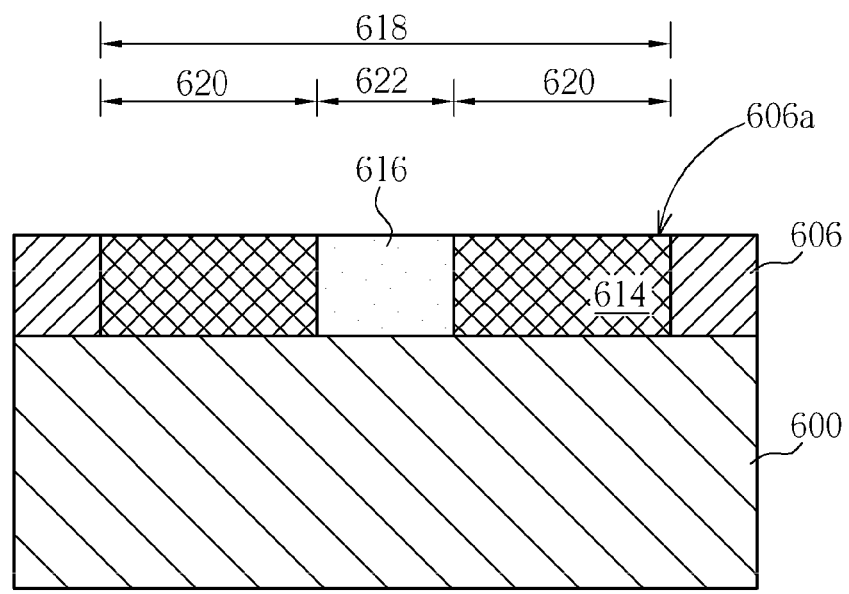
Figure 18B:
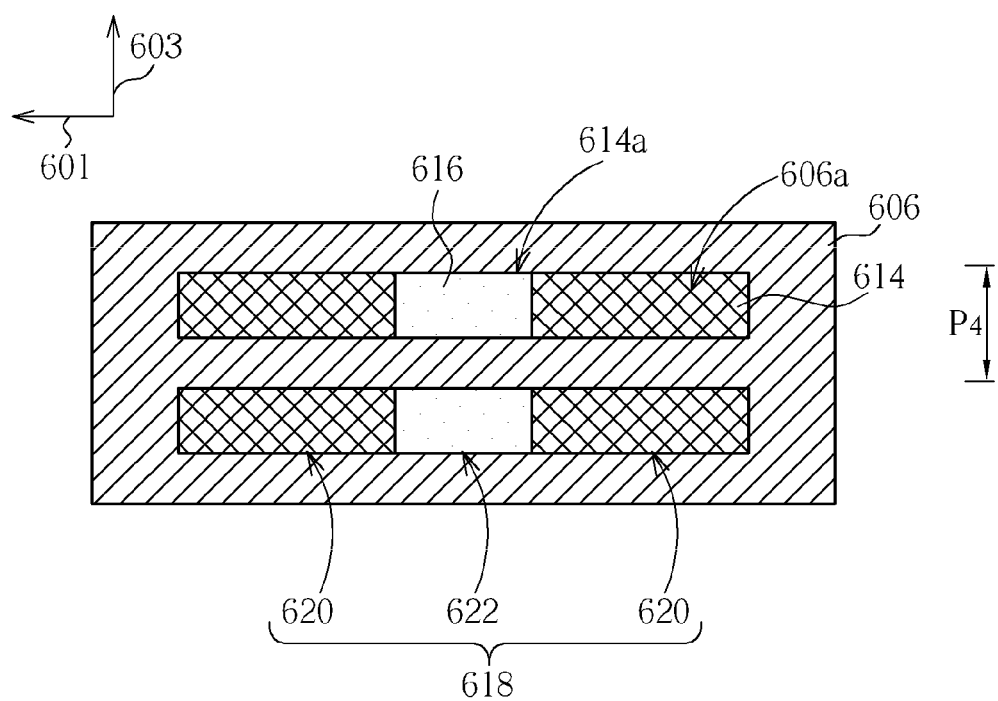

As shown in FIG. 18A and FIG. 18B, a third material layer 616 is formed on the substrate 600 to at least completely fill the second trench 614a. The third material layer 616 can be formed by, for example, a chemical vapor deposition (CVD) process, or an epitaxial process. The third material layer 616 includes an inter-dielectric layer (ILD)/inter-metal dielectric layer (IMD) layer material such as $SiO_2$, or epitaxial silicon. A planarization process, such as a CMP process or an etching back process, is performed to make the first patterned material layer 606, the second patterned material layer 614 and the third material layer 616 level with each other. As shown in FIG. 18A and FIG. 18B, a first trench 606a is defined in the first patterned material layer 606. The first trench 606a is filled with the second patterned material layer 614 and the third material layer 616, wherein the third material layer 616 separates the first trench 606a into two parts. The second patterned material layer 614 and the third material layer 614 in the first trench 606a have a nearly rectangular pattern. Through the above methods, the right-angled corner rounded phenomenon caused by OPE can be alleviated.

As shown in FIG. 18A and FIG. 18B, the present invention provides a semiconductor structure including a substrate 600, a first patterned material layer 606, a second patterned material layer 614 and the third material layer 616. A trench region 616 is defined on the substrate 600. The trench region 616 includes two first regions 620 and a second region 622, wherein the second region 622 is located between two first regions 620 and is adjacent to the first regions 620. The first patterned material layer 606 is disposed on the substrate 600 outside the trench region 618. The second patterned material layer 614 is disposed in the two first regions 620. The third material layer 616 is disposed in the second region 622. As shown in FIG. 18B, in one embodiment, the third material layer 616 is disposed only in the second region 622. In another embodiment, by using another forming method, as shown in FIG. 13B for example, the third material 616 (similar to the first patterned material layer 506 in FIG. 13B) can be disposed in the regions outside the trench region 618. For example, the third material layer 616 can connect two or more than two trench regions 618. The first patterned material layer 606, the second patterned material layer 614 and the third material layer 616 are level with other. In one embodiment, the first patterned material layer 606 and the second patterned material layer 614 includes different dielectric materials, and the third material layer 616 includes epitaxial silicon. In another embodiment, the first patterned material layer 606 and the third material layer 616 includes different dielectric materials, and the second patterned material layer 614 includes a conductive material (refer to the embodiment in FIG. 9).

Figure 19:
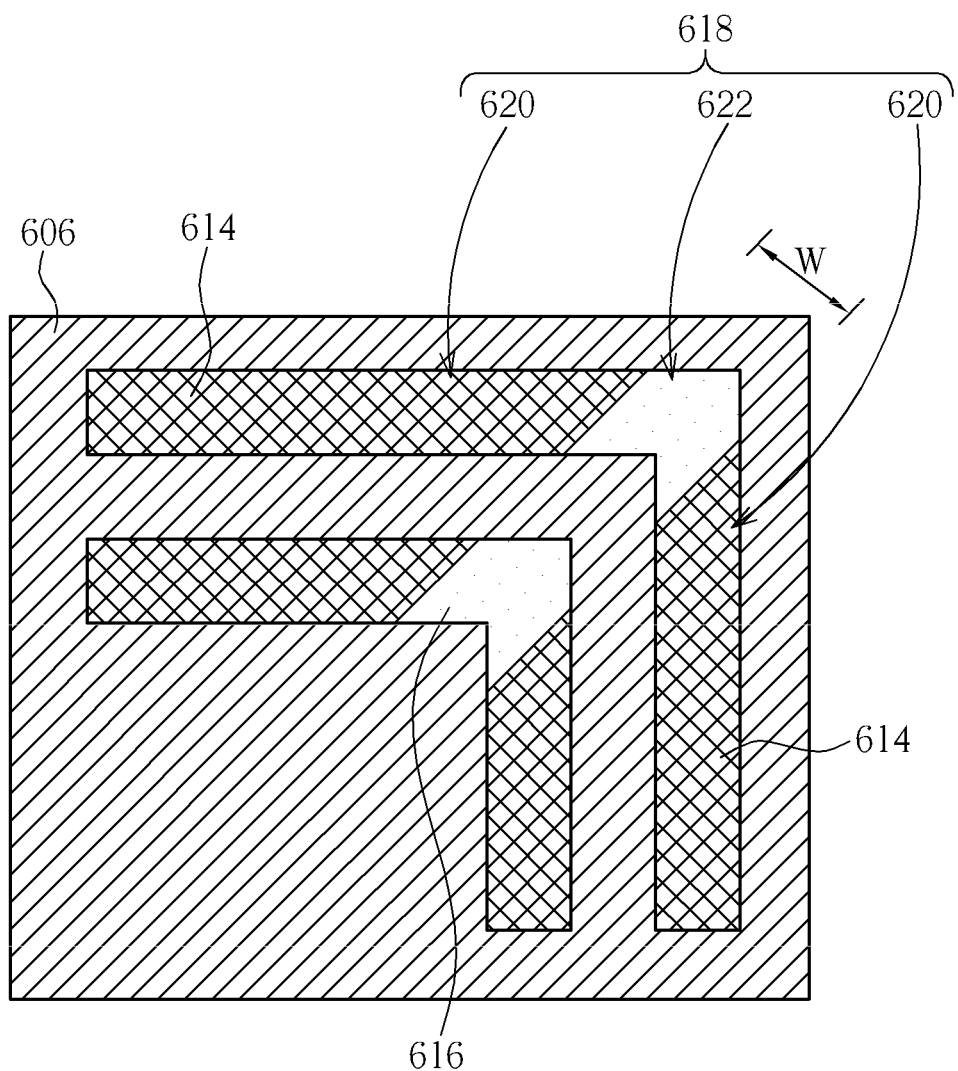
FIG. 19 illustrates a schematic diagram of the semiconductor structure according to one embodiment of the present invention.

The above embodiment discloses the trench region 618 having a rectangular shape. In another embodiment, the trench region 618 can has a turning corner. Please refer to FIG. 19, illustrating a schematic diagram of the semiconductor structure according to one embodiment of the present invention. As shown in FIG. 19, the first regions 620 of the trench region 618 have a trapezoidal shape. The second region 622 includes at least one set of parallel sides having a distance width W therebetween. In one embodiment, the width W is substantially equal to the critical dimension of the exposure system used in the semiconductor manufacturing method.

By using the double-exposure technique provided in the present invention, the trenches or the stripe structures of the semiconductor structure proposed in the present invention can include a nearly rectangular pattern that is free of the right-angled corner rounded pattern.

Those skilled in the art will readily observe that numerous modifications and alterations of the device and method may be made while retaining the teachings of the invention.

What is claimed is:

1. A semiconductor structure, comprising:
   a substrate having at least a trench region, wherein from top view of the substrate, the trench region includes two separated first regions, and a second region between and adjacent to the two first regions;
   a first material layer disposed on the substrate outside the trench region;
   a second material layer disposed in the second region; and
   a third material layer only disposed in the first regions, wherein a top surface of the third material layer is level with a top surface of the first material layer and a top surface of the second material layer, and a bottom surface of the third material layer is level with a bottom surface of the first material layer and a bottom surface of the second material layer.

2. The semiconductor structure according to claim 1, wherein the first material layer and the second material layer comprise different dielectric materials.

3. The semiconductor structure according to claim 1, wherein the second region comprises a set of parallel sides.

4. The semiconductor structure according to claim 1, wherein the second material layer is disposed only in the second region.

5. The semiconductor structure according to claim 1, wherein the second material layer is further disposed in the region outside the trench region and extends to a second region of another trench region.

6. The semiconductor structure according to claim 1, wherein the two first regions include a substantially trapezoidal shape.

7. The semiconductor structure according to claim 1, wherein the trench region includes a substantially rectangular shape.

8. The semiconductor structure according to claim 1, wherein the first material layer and the third material layer include different dielectric materials and the second material layer includes silicon.

9. The semiconductor structure according to claim 1, wherein the first material layer and the second material layer include different dielectric materials and the third material layer includes conductive material.

10. A method of manufacturing a semiconductor structure, comprising:
    providing a substrate having a trench region, wherein from top view of the substrate, the trench region includes two separated first regions, and a second region adjacent to and between the two first regions;
    forming a first material layer on the substrate and then removing the first material layer in the trench region to form a first patterned material layer;
    forming a second patterned material layer in the second region on the substrate;
    forming a third material layer only in the first regions,
    wherein after forming the first patterned material layer, the second patterned material layer and the third material layer, a top surface of the third material layer is level with a top surface of the first patterned material layer and a top surface of the second patterned material layer, and a bottom surface of the third material layer is level with a bottom surface of the first material layer and a bottom surface of the second patterned material layer.

11. The method of manufacturing a semiconductor structure according to claim 10, wherein the second region comprises a set of parallel sides.

12. The method of manufacturing a semiconductor structure according to claim 10, wherein the first patterned material layer comprises an etching selectivity with respect to the second patterned material layer.

13. The method of manufacturing a semiconductor structure according to claim 10, wherein the first patterned material layer is formed before the second patterned material layer.

14. The method of manufacturing a semiconductor structure according to claim 10, wherein the first patterned material layer is formed after the second patterned material layer.

15. The method of manufacturing a semiconductor structure according to claim 10, wherein the third material layer is formed after the first patterned material layer and the second patterned material layer.

16. The method of manufacturing a semiconductor structure according to claim 15, wherein the first material layer and the second patterned material layer include different dielectric materials and the third material layer includes conductive material.

17. The method of manufacturing a semiconductor structure according to claim 10, wherein the third material layer is formed after the first patterned material layer and before the second patterned material layer.

18. The method of manufacturing a semiconductor structure according to claim 17, wherein the first material layer and the third material layer include different dielectric materials and the second patterned material layer includes silicon.

19. The method of manufacturing a semiconductor structure according to claim 10, wherein forming the first patterned material layer comprises using a first mask pattern and forming the second patterned material layer comprises using a second mask pattern, wherein the first mask pattern is substantially perpendicular to the second mask pattern.

20. A method of manufacturing a semiconductor structure, comprising:

providing a substrate having a trench region, wherein the trench region includes two separated first regions, and a second region adjacent to and between the two first regions;

forming a first material layer on the substrate and then removing the first material layer in the trench region to form a first patterned material layer forming a second patterned material layer in the second region on the substrate, wherein the second patterned material layer is level with the first patterned material layer; and after forming the first patterned material layer and the second patterned material layer, performing an etching process by using the first patterned material layer and the second patterned material layer as a mask to etch the substrate.

* * * * *